(12) United States Patent
Busekrus

(10) Patent No.: US 12,100,949 B2
(45) Date of Patent: Sep. 24, 2024

(54) CONTROLLING OPERATION OF A SECONDARY POWER SUPPLY OF AN ELECTRICITY METER DURING AC POWER LOSS

(71) Applicant: Landis+Gyr Innovations, Inc., Alpharetta, GA (US)

(72) Inventor: Doug Busekrus, Lafayette, IN (US)

(73) Assignee: Landis+Gyr Technology, Inc., Alpharetta, GA (US)

(*) Notice: Subject to any disclaimer, the term of this patent is extended or adjusted under 35 U.S.C. 154(b) by 402 days.

(21) Appl. No.: 17/719,341

(22) Filed: Apr. 12, 2022

(65) Prior Publication Data

US 2023/0327437 A1  Oct. 12, 2023

(51) Int. Cl.
*H02J 3/00* (2006.01)
*G01D 4/00* (2006.01)

(52) U.S. Cl.
CPC ............ *H02J 3/0012* (2020.01); *G01D 4/002* (2013.01); *G01D 2204/22* (2021.05)

(58) Field of Classification Search
CPC ... G01D 2204/22; G01D 4/002; H02J 3/0012; G01R 22/063
USPC ......................................................... 700/292
See application file for complete search history.

(56) References Cited

U.S. PATENT DOCUMENTS

| | | | | |
|---|---|---|---|---|
| 5,828,207 A | * | 10/1998 | Saadeh | H02J 9/061 307/66 |
| 6,788,040 B2 | * | 9/2004 | Lubomirsky | H02J 9/061 323/303 |
| 2013/0293219 A1 | * | 11/2013 | Ramirez | G01R 22/10 324/103 R |
| 2014/0247626 A1 | | 9/2014 | Lee | |
| 2019/0190370 A1 | * | 6/2019 | Martin | H02M 1/4225 |
| 2022/0271670 A1 | * | 8/2022 | Song | H02M 1/36 |
| 2023/0216332 A1 | * | 7/2023 | Huang | H02J 9/061 307/64 |

FOREIGN PATENT DOCUMENTS

| | | |
|---|---|---|
| EP | 0708998 A1 | 5/1996 |
| EP | 3503370 A1 | 6/2019 |

OTHER PUBLICATIONS

PCT Patent Application No. PCT/US2023/018028, International Search Report and Written Opinion, Aug. 8, 2023, 10 pages.

* cited by examiner

*Primary Examiner* — Chun Cao
(74) *Attorney, Agent, or Firm* — Kilpatrick Townsend & Stockton LLP

(57) ABSTRACT

An AC line voltage detection circuit includes an AC sense circuit, a power supply control circuit, and a power supply hold-up circuit. The AC sense circuit is configured to generate a signal to a processor and to the power supply control circuit in response to sensing an absence of AC line voltage. The power supply control circuit is configured to generate a control signal to a power supply that provides power to the processor to shut down the power supply. The processor is configured generate a signal to the power supply hold-up circuit configured to generate a signal to the power supply control circuit to prevent shut down of the power supply. The power supply hold-up circuit signal overrides the AC sense circuit signal. The processor is further configured to generate a subsequent signal to the power supply hold-up circuit to permit shut down of the power supply.

24 Claims, 5 Drawing Sheets

CONTROLLING OPERATION OF A SECONDARY POWER SUPPLY OF AN ELECTRICITY METER DURING AC POWER LOSS

BACKGROUND

Unless otherwise indicated herein, the materials described in this section are not prior art to the claims in this application and are not admitted prior art by inclusion in this section.

An electricity meter measures electrical power consumed by a customer of an electric utility provider. The electricity meter is plugged into a meter socket that is mounted in an enclosure on a building or other structure and draws its operating power from the electrical power distribution grid. Electricity meters record electric energy consumption and communicate the information as well as status information of the meter itself to the utility provider for monitoring and billing. When an alternating current (AC) power outages occur, an electricity meter is no longer able to communicate with the utility provider.

In order to operate a radio to enable the electricity meter to provide a "last gasp" communication to the utility provider when a power outage occurs, electricity meters may rely on energy stored in storage capacitors to maintain operation of communication circuitry for a limited time period. The stored energy needs to be sufficient to operate the electricity meter power supply to maintain radio operation. The capacitors needed to store sufficient energy to operate the radio for a long enough time period can be large and expensive. Efficient power supply operation can maximize the time the radio can be operated on the limited energy available from the storage capacitors.

SUMMARY

Systems and methods for operation of a power supply for an electricity meter during a power outage may be provided.

According to various aspects there is an alternating current (AC) line voltage detection circuit. In some aspects, the AC line voltage detection circuit may include an AC sense circuit, a power supply control circuit, and a power supply hold-up circuit. The AC sense circuit may be configured to generate a signal to a processor and to the power supply control circuit in response to sensing an absence of AC line voltage. In response to receiving the signal from the AC sense circuit, the power supply control circuit may be configured to generate a control signal to a power supply to shut down the power supply. The power supply may be configured to provide power to the processor.

In response to receiving the signal from the AC sense circuit, the processor may be configured generate a signal to the power supply hold-up circuit. In response to receiving the signal from the processor, the power supply hold-up circuit may be configured to generate a signal to the power supply control circuit to prevent shut down of the power supply. The signal generated by the power supply hold-up circuit may override the signal from the AC sense circuit. The processor may be further configured to generate a subsequent signal to the power supply hold-up circuit to permit shut down of the power supply.

According to various aspects there is provided an electricity meter. In some aspects, the electricity meter may include a processor configured to control operations of portions of circuitry of the electricity meter, a power supply configured to supply power to the processor, and an alternating current (AC) line voltage detection circuit. The AC line voltage detection circuit may include an AC sense circuit, a power supply control circuit, and a power supply hold-up circuit.

The power supply control circuit may be configured to generate a signal to the power supply based on a signal received from the AC sense circuit and a signal received from the power supply hold-up circuit. The signal generated by the power supply control circuit may cause the power supply to either maintain operation or shut down according to the signals received from the AC sense circuit and the power supply hold-up circuit.

According to various aspects there is provided a method for operating an electricity meter during a loss of alternating current (AC) power. In some aspects, method may include sensing, by an AC line voltage detection circuit, an absence of AC line voltage; generating, by an AC sense circuit of the AC detection circuit, a first signal to a processor of the electricity meter indicating a sensed loss of AC line voltage; generating, by a power supply control circuit of the AC detection circuit, a second signal configured to cause a power supply to shut down. The power supply may be configured to supply power to the processor.

The method may further include in response to receiving the first signal, generating, by the processor, a third signal to a hold-up circuit of the AC detection circuit to prevent shut down of the power supply; and in response to receiving the third signal, generating, by the power supply control circuit, a fourth signal to the power supply. The fourth signal may be configured to maintain operation of the power supply and enable the processor to complete power-loss operations. The fourth signal may override the second signal during the loss of AC line voltage.

The method may further include generating, by the processor, upon completion of the power loss operations, a fourth signal to the hold-up circuit indicating that the processor has completed the power-loss operations; and generating, by the hold-up circuit, a fifth signal to the power supply, wherein the fifth signal causes the power supply to shut down. Shutting down the power supply shuts down the processor and other circuitry powered by the power supply.

BRIEF DESCRIPTION OF THE DRAWINGS

Aspects and features of the various embodiments will be more apparent by describing examples with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

An electricity meter measures electrical power consumed by a customer of an electric utility provider. The electricity meter is plugged in to a meter socket that is mounted in an enclosure on a building or other structure and provides a connection between the electric power delivered by the electrical utility and the customer. The electricity meter measures and controls the electricity delivered to the customer premises via the grid. The electricity meter may be combined with a communications module to enable the meter to communicate with other meters and with the utility. The electricity meter may be part of a utility management system.

Figure 1:
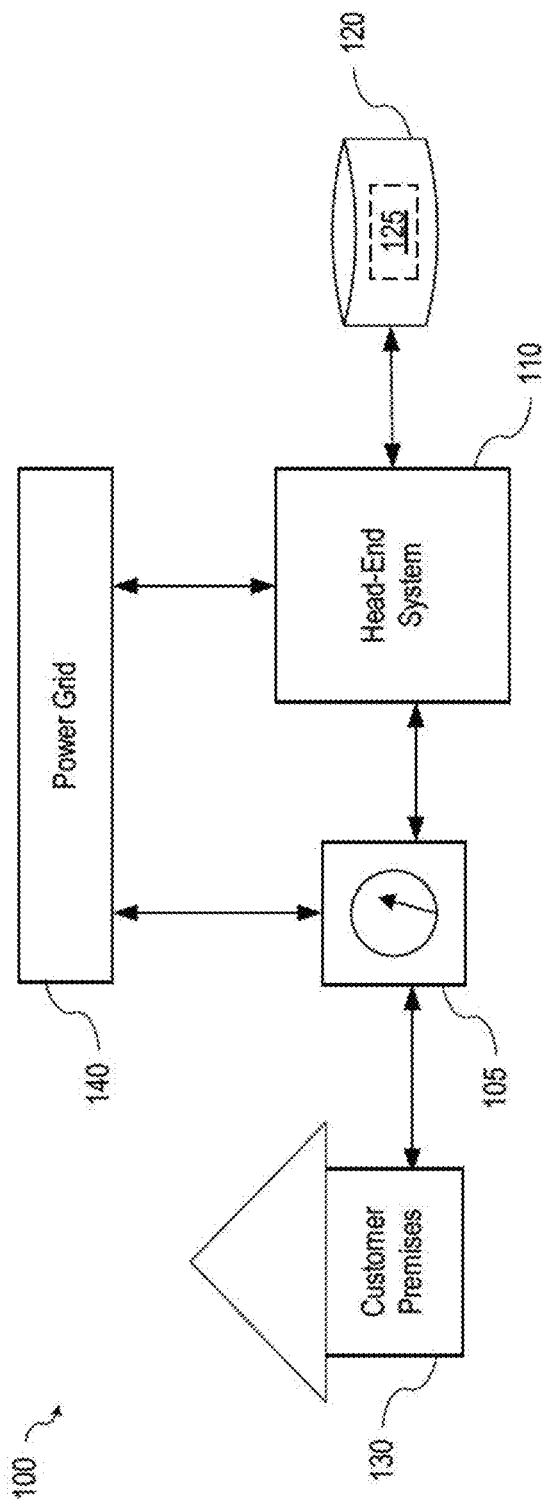
FIG. 1 is diagram illustrating a utility management system according to some aspects of the present disclosure.

FIG. 1 is a diagram illustrating a utility management system 100 according to various aspects of the present disclosure. Referring to FIG. 1, the utility management system 100 may include an electricity meter 105, a head-end system 110, and a storage device 120. While FIG. 1 illustrates one electricity meter 105 for ease of explanation, one of ordinary skill in the art will appreciate that a plurality of electricity meters 105 may be included in the disclosed utility management system 100 without departing from the scope of the present disclosure.

The electricity meter 105 may monitor and/or record the energy usage at the customer premises 130 and communicate the information about energy usage to the head-end system 110. For example, the electricity meter 105 may continually monitor and record total energy usage at the customer premises 130. In accordance with various aspects of the present disclosure, the electricity meter 105 may monitor and/or record days of the week and times of the day related to energy usage at the customer premises 130 and communicate the information to the head-end system 110. In addition, the electricity meter 105 may perform as a sensor to detect and/or record abnormal measurements and/or events, for example, but not limited to, power outages. One of ordinary skill in the art will appreciate that other information, for example, but not limited to, average power consumed, peak power, etc., may be monitored and communicated by the electricity meter 105.

The electricity meter 105 may communicate with the head-end system 110 and/or with other electricity meters via wired or wireless communication interfaces known to those of skill in the art using communication protocols appropriate to the specific communication interface. Different wired or wireless communication interfaces and associated communication protocols may be implemented on the electricity meter 105 for communication with the head-end system 110. For example, in some embodiments a wired communication interface may be implemented, while in other embodiments a wireless communication interface may be implemented for communication between the electricity meter 105 and the head-end system 110. In some embodiments, a wireless mesh network may connect a plurality of electricity meters 105. The plurality of electricity meters 105 may transmit data to a collector (not shown) that communicates with another network to transmit the data to the head-end system 110. The electricity meters 105 may use radio frequency (RF), cellular, or power line communication to communicate. One of ordinary skill in the art will appreciate that other communication methods may be used without departing from the scope of the present disclosure.

The head-end system 110 may include a storage device 120. The storage device 120 may be, for example, but not limited to, one or more hard-disk drives, solid-state memory devices, or other computer-readable storage media. One of ordinary skill in the art will appreciate that other storage configurations may be used without departing from the scope of the present disclosure. A database 125 may be stored on the storage device 120. The database 125 may store information collected from the electric meter 105. For example, the database 125 may include days of the week and times of the day correlating with load operating information, for example, but not limited to, average power consumed by the load, peak power consumed by the load, etc. One of ordinary skill in the art will appreciate that this information is exemplary and that other information may be included in the database 125 without departing from the scope of the present disclosure.

The head-end system 110 and the electricity meter 105 may be connected to an electrical power distribution grid 140. The electrical power distribution grid 140 may include generating stations (not shown) that produce electric power (not shown), electrical substations (not shown) for stepping electrical voltage up for transmission or stepping electrical voltage down for distribution, high voltage transmission lines (not shown), and distribution lines (not shown).

Figure 2:
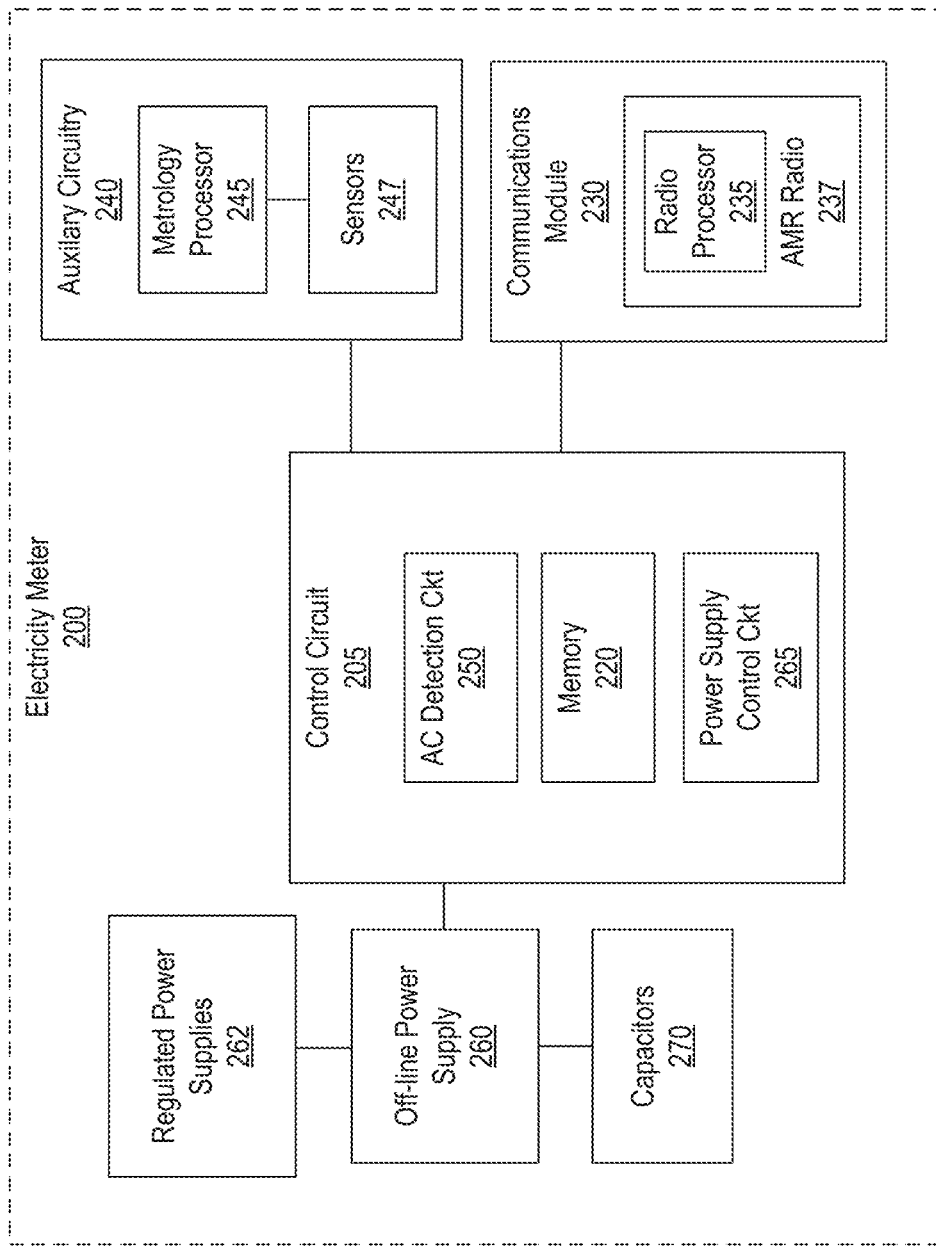
FIG. 2 is a block diagram illustrating an example of an electricity meter according to various aspects of the present disclosure.

FIG. 2 is a simplified block diagram illustrating an example of an electricity meter 200 according to some aspects of the present disclosure. The electricity meter 200 may be, for example, the electricity meter 105 of FIG. 1. The electricity meter 200 may also be referred to as a smart meter or a smart electricity meter. The electricity meter 200 may include a control circuit 205, a communications module 230, auxiliary circuitry 240, an off-line switching power supply 260, one or more regulated power supplies 262, and one or more storage capacitors 270.

The control circuit 205 may include a memory 220, AC detection circuitry 250, and a power supply control circuit 265. The power supply control circuit 265 may control operation of the off-line switching power supply 260 during normal operation of the electricity meter 200. For example, the power supply control circuit 265 may monitor and control the duty cycle and/or frequency of operation of a pulse width modulator (PWM) of the off-line switching power supply 260 according to load conditions on the off-line switching power supply 260.

The auxiliary circuitry 240 may include, among other components, sensors 247 and a metrology processor 245. The metrology processor 245 may be, for example, but not limited to, a general-purpose processor, a digital signal processor (DSP), an application specific integrated circuit (ASIC), a field programmable gate array (FPGA) or other programmable logic device. The metrology processor 245 may be in electrical communication with the memory 220, the communications module 230 (e.g., the radio processor 235), and the sensors 247. The metrology processor 245 may receive data generated by various sensors 247 of the electricity meter 200 including, but not limited to, energy use, voltage, current, etc., and may perform operations on, or processing of, the data. The metrology processor 245 may communicate with the communications module 230 to transmit various operational parameters (e.g., energy usage), diagnostic data (e.g., error conditions), or other electricity meter information (e.g., GPS coordinates) to a head-end system and/or to other electric meters via a wired or wireless network. The metrology processor 245 may also communicate with the one or more regulated power supplies 262.

The AC detection circuitry 250 may detect a loss of AC power to the electricity meter 200 from the electrical power grid, for example, from a substation or other source of AC power. When AC power is applied to the electricity meter 200, the AC detection circuitry 250 may generate one or more AC detection signals indicating that AC power is present. For example, the AC detection circuitry 250 may generate a time-varying signal such as a square wave signal having a frequency approximately the same as the frequency of the AC line voltage from the electrical power grid. Other signals may be used without departing from the scope of the present disclosure.

The AC detection signals may be received by the metrology processor 245. In response to detecting a loss of AC power, the AC detection circuitry 250 may generate one or more AC power loss signals. The AC power loss signals may be, for example, a signal having a substantially constant DC voltage level. Other signals may be used without departing from the scope of the present disclosure. The AC power loss signals may be received by the metrology processor 245. The AC power loss signals may cause the metrology processor 245 to control operation of one or more of the regulated power supplies 262 to conserve energy stored by the electricity meter 200, for example, by the one or more storage capacitors 270, needed for last-gasp communications.

The memory 220 may be a storage device such as a solid-state storage device or other storage device and may be a combination of volatile and non-volatile storage or memory. The memory 220 may be configured to communicate with various processors (e.g., a metrology processor, a radio processor, etc.) included in the electricity meter 200. In some implementations, portions of the memory 220 may be included in the various processors. The memory 220 may be configured to store instructions executable by the various processors, as well as data generated by the various sensors of the smart meter 200 and other applications executable by the various processors.

The communications module 230 may be a wired or wireless transceiver operable to communicate via various wired or wireless protocols as known in the field for example, but not limited to, the AMI protocol, RF protocols, cellular protocols, PLC network protocols, etc. The communications module 230 may include a radio processor 235 configured to control operation of the communications module 230. The radio processor 235 may be, for example, but not limited to, a general-purpose processor, a digital signal processor (DSP), an application specific integrated circuit (ASIC), a field programmable gate array (FPGA) or other programmable logic device. The radio processor 235 may be in electrical communication with the memory 220 and/or with the metrology processor 245.

In some implementations, the communications module 230 may include AMI devices and/or AMR devices, including an AMI radio and/or an AMR radio 237. The AMI radio and/or AMR radio 237 may transmit data to and receive data from the head-end system using radio frequency (RF) technologies or power line communication (PLC). The communications module 230 may enable the electricity meter 200 to communicate with other electricity meters in a network (e.g., an AMI network) and with the utility provider (e.g., a head-end system). The communications module 230 may transmit data and alarm signals to the utility provider and receive any of updated program instructions, firmware updates, updates to other settings, or other communications.

The sensors 247 may include, but are not limited to, voltage sensors, current sensors, accelerometers, tilt switches, temperature sensors, and other sensors configured to monitor electrical and physical characteristics of the electricity meter 200.

The off-line switching power supply 260 may be a direct current (DC) power supply and may receive a primary DC voltage generated by rectifying a primary alternating current (AC) voltage from the grid to which the electricity meter 200 is connected. The power supply 260 may also be referred to herein as an off-line switching power supply or an off-line power supply. In some implementations, the off-line switching power supply 260 may receive and rectify the primary AC voltage. The off-line switching power supply 260 may generate a lower secondary DC voltage from the primary DC voltage. The secondary DC voltage generated by the off-line switching power supply 260 may supply DC power to other components of the electricity meter 200.

The one or more regulated power supplies 262 may receive the secondary DC voltage output from the off-line switching power supply 260 and may regulate the secondary DC voltage to lower DC voltages for operating other circuitry of the electricity meter 200, for example, but not limited to, the communications module 230 (e.g., the AMI radio and/or AMR radio 237 and the radio processor 235), as well as the auxiliary circuitry 240 (e.g., the metrology processor 245, the sensors 247, etc.).

The storage capacitors 270 may provide primary power to the electricity meter 200 for a short period of time immediately after a power outage. The storage capacitors 270 may be electric double layer capacitors (EDLC), also referred to as an ultracapacitors or supercapacitors, or another type of capacitor. The storage capacitors 270 may store sufficient energy to operate the off-line switching power supply 260 for a limited period of time to enable the electricity meter 200 to transmit a "last gasp" message to the head-end system. The last gasp message may include a notification of the power outage as well as other information (e.g., energy usage, error conditions, or other electricity meter information) at the time power was lost.

Figure 3:
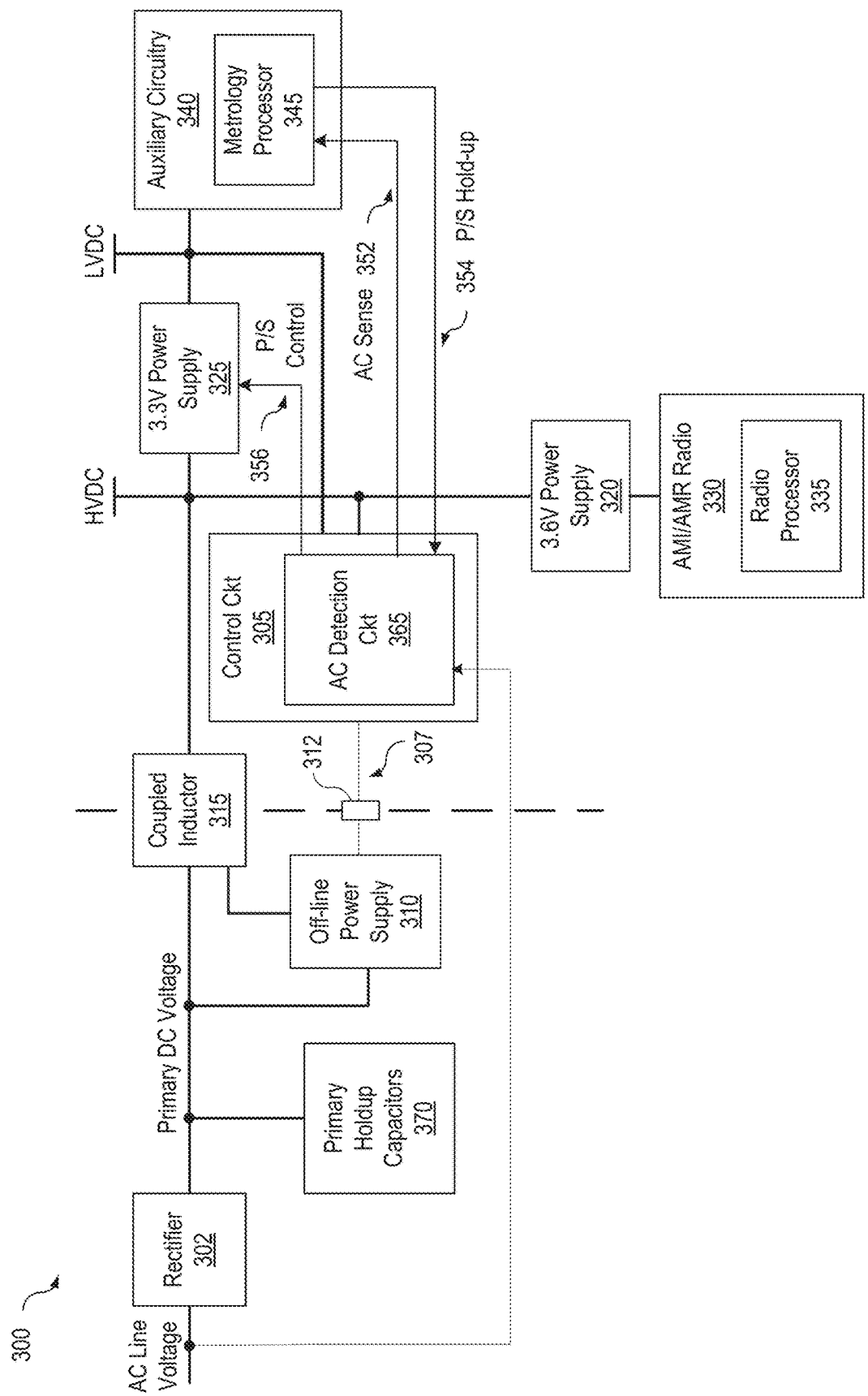
FIG. 3 is a simplified block diagram illustrating an example of an electricity meter showing power and control signals according to some aspects of the present disclosure.

FIG. 3 is a simplified block diagram illustrating an example of an electricity meter 300 showing power and control signals according to some aspects of the present disclosure. Referring to FIG. 3, the electricity meter 300 may include an off-line switching power supply 310, a first regulated power supply 320, a second regulated power supply 325, a control circuit 305, and an AMI/AMR radio 330. The AMI/AMR radio 330 may include a radio processor 335. The radio processor 335 may be configured to receive data and instructions from the head end system and communicate data received from the metrology processor 345 to the head end system.

The control circuit 305 may be, for example, the control circuit 205 in FIG. 2. The control circuit 305 may operate to provide a feedback signal 307 to the off-line switching power supply 310 via the isolation device 312 for control of the off-line switching power supply 310. The control circuit 305 may include AC detection circuitry 365. The AC detection circuitry 365 may be, for example, the AC detection circuitry 250 in FIG. 2. The off-line switching power supply 310 may operate with an input voltage from a primary DC voltage of the electricity meter 300. The primary DC voltage may be a generated from an AC line voltage rectified by a full wave rectifier 302. The primary DC voltage may be, for example, 350 volts DC (VDC) or another DC voltage. The off-line switching power supply 310 may supply a secondary DC voltage HVDC to the first regulated power supply 320 and the second regulated power supply 325.

The off-line switching power supply 310 may be a switching power supply, for example, but not limited to a buck-boost power supply or other power supply, operable to convert the primary DC voltage into a lower secondary DC voltage HVDC. The secondary DC voltage HVDC may be for example, 12 VDC or another DC voltage. The off-line switching power supply 310 may convert the primary DC voltage to the secondary DC voltage HVDC by periodically transferring energy stored in the primary winding of the coupled inductor 315 to the secondary winding of the coupled inductor 315. Electrical isolation (e.g., galvanic isolation) between circuitry connected to the primary DC voltage and circuitry connected to the secondary DC voltage may be provided by the coupled inductor 315. In some implementations, the coupled inductor 315 may be a transformer. Isolated feedback of the secondary DC voltage HVDC may be provided to the off-line switching power supply 310 via an isolation device 312, for example, but not limited to, an opto-coupler or other isolation device.

The first regulated power supply 320 may be a switching power supply or other power supply operable to convert the secondary DC voltage HVDC provided by the off-line switching power supply 310 to a lower voltage, for example 3.6 VDC or another DC voltage. The first regulated power supply 320 may supply power for components of the electricity meter 300, for example, but not limited to, the AMI radio and/or AMR radio 330.

The second regulated power supply 325 may be a switching power supply or other power supply operable to convert the secondary DC voltage HVDC provided by the off-line switching power supply 310 to a low voltage DC (LVDC), for example 3.3 VDC or another DC voltage. The second regulated power supply 325 may supply power for the metrology processor 345 as well as other auxiliary circuitry 340 and/or components that are not required to be operated after an AC power outage. The auxiliary circuitry 340 and the metrology processor 345 and/or components may be switched off after an AC power outage.

The AC detection circuit 365 may monitor the AC line voltage from the electrical power grid and may generate an AC sense signal 352 to the metrology processor 345. While AC line voltage is present, the AC detection circuit 365 may generate a time-varying signal, for example, a square wave signal having a frequency approximately the same as the frequency of the AC line voltage or another signal, indicating to the metrology processor that AC line voltage is present. The AC detection circuit 365 may generate a power supply control signal 356 to enable operation of the second regulated power supply 325 while AC line voltage is present.

When an AC power outage occurs, the AC detection circuit 365 may detect that AC line voltage is no longer available. The AC detection circuit 365 may generate an AC sense signal 352 indicating the AC power loss, for example, a signal having a substantially constant DC voltage level or another signal, to indicate to the metrology processor 345 that AC power has been lost. In response to receiving the AC sense signal 352 indicating the AC power loss, the metrology processor 345 may perform operations such as conducting electrical measurements, handing off data to the radio processor, etc., to enable last gasp communications to the head end system.

The metrology processor 345 may generate a power supply hold-up signal 354 to the AC detection circuit 365. The power supply hold-up signal 354 may prevent the AC detection circuit 365 from disabling operation of the second regulated power supply 325 via the power supply control signal 356 until the metrology processor 345 has finished its power-loss operations. After the power-loss operations are completed, the metrology processor 345 may change the state of the power supply hold-up signal 354 and the AC detection circuit 365 may subsequently change the state of the power supply control signal 356 to disable operation of the second regulated power supply 325. Disabling operation of the second regulated power supply 325 eliminates all additional current drawn by the second regulated power supply 325 and any auxiliary circuitry 340 powered by the second regulated power supply 325, including the metrology processor 345, thereby conserving energy that can be used for last gasp communications by the AMI/AMR radio 330.

Figure 4:
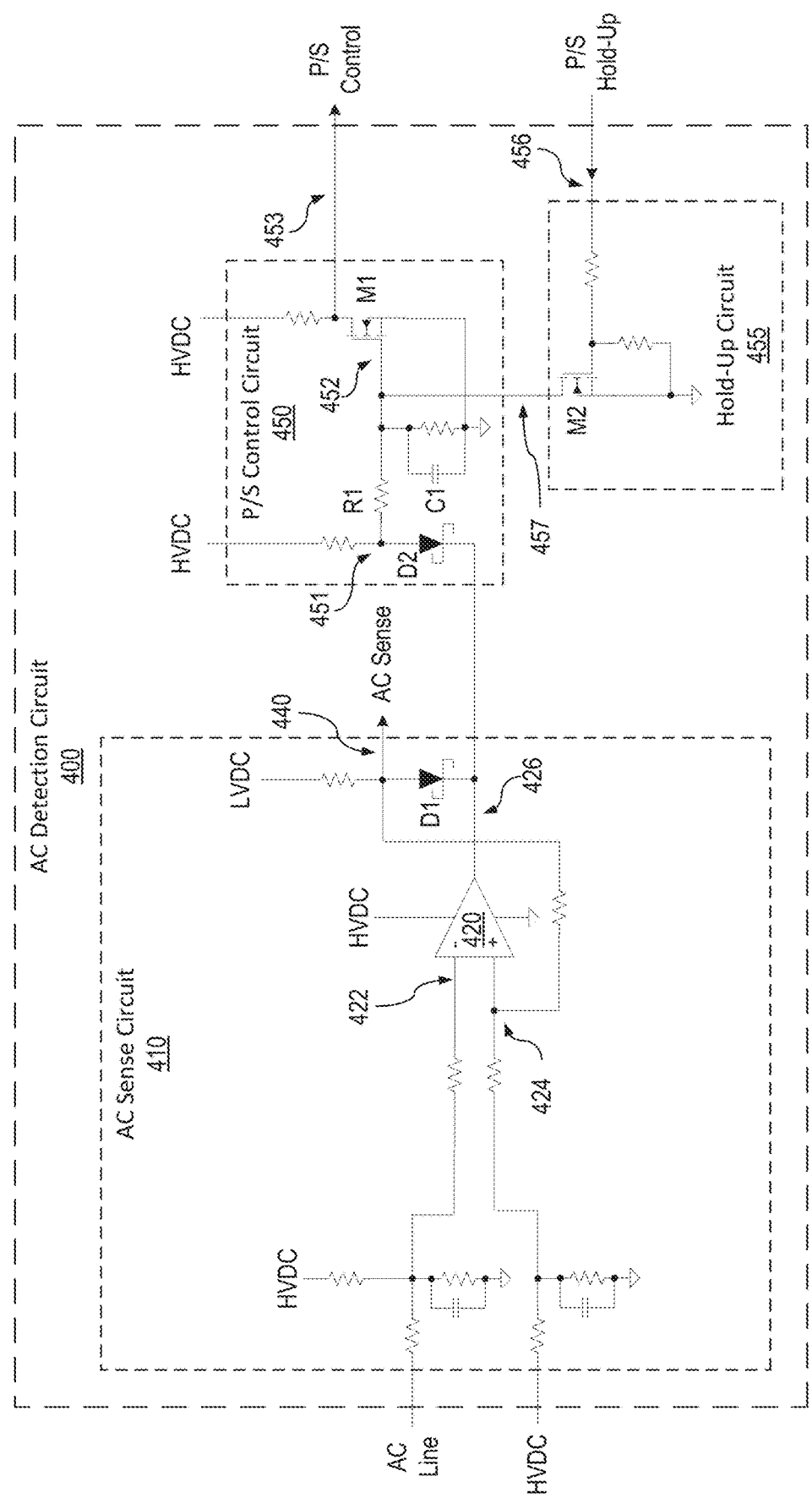
FIG. 4 is a simplified block diagram illustrating an example of an AC detection circuit according to some aspects of the present disclosure.

FIG. 4 is a simplified block diagram illustrating an example of an AC detection circuit 400 according to some aspects of the present disclosure. Referring to FIG. 4, the AC detection circuit 400 may include an AC sense circuit 410, a power supply control circuit 450, and a power supply hold-up circuit 455. The AC sense circuit 410 may include a comparator 420 configured to detect the presence of an AC line voltage. As illustrated in FIG. 4, a voltage representative of the AC line voltage may be applied to a first input 422 of the comparator 420. A voltage representative of the HVDC voltage level (e.g., the approximately 12 V HVDC generated by the off-line switching power supply 310) may be applied to a second input 424 of the comparator 420.

With AC line voltage present, the output signal 426 of the comparator 420 may change state between a high state and a low state as the voltage representative of the AC line voltage applied to the first input 422 of the comparator 420 exceeds the voltage representative of the HVDC applied to the second input 424 of the comparator 420. The diode D1 causes the AC sense signal 440 to change state between a low state of approximately zero volts and a high state of approximately the LVDC voltage level (e.g., the approximately 3.3 V LVDC generated by the second regulated power supply 325) resulting in a square wave signal having approximately the same frequency as the frequency of the AC line voltage. The AC sense signal 440 may be the AC sense signal 352 illustrated in FIG. 3. The square wave AC sense signal 440 may be received by the metrology processor (e.g., the metrology processor 345) as an indication the AC line voltage is present.

When an AC power outage occurs, a second voltage representative of the HVDC voltage level may be applied to the first input 422 of the comparator 420 in place of the voltage representative of the AC line voltage. The second voltage representative of the HVDC voltage level applied to the first input 422 of the comparator 420 may be lower than voltage representative of the HVDC voltage level applied to the second input 424 of the comparator 420. As a result, the output signal 426 of the comparator 420 may cease changing state and may maintain a high state. With the output signal 426 of the comparator 420 in a high state, the AC sense signal 440 may also maintain a high state. The high state AC sense signal 440 may be received by the metrology processor (e.g., the metrology processor 345) as an indication of loss of AC line voltage.

Other circuitry configured to detect the presence and absence of AC line voltage and generate corresponding sense signals may be used without departing from the scope of the present disclosure.

The output signal 426 of the comparator 420 may also be received by the power supply control circuit 450. The power supply control circuit 450 may include a diode D2, a capacitor C1, a resistor R1, and a first circuit M1. The first circuit M1 may be, for example, a metal-oxide field-effect transistor, logic circuitry, or another type of transistor or circuit. With AC line voltage present, the output signal 426 of the comparator 420 may change state between a high state and a low state as explained above. The diode D2 causes the signal 451 at the anode of diode D2 to toggle between a low state of approximately zero volts and a high state of approximately the HVDC voltage level (e.g., the approximately 12 V HVDC generated by the off-line switching power supply 310) resulting in a square wave signal having approximately the same frequency as the frequency of the AC line voltage.

The time constant provided by R1 and C1 discharges C1 through the comparator 420 each time the output signal 426 of the comparator 420 switches to a low state, thereby preventing the gate drive signal 452 for M1 from reaching a voltage high enough to turn on circuit M1. With M1 maintained in an off state, the power supply control signal 453 is maintained in a high state. The power supply control signal 453 may be the power supply control signal 356 shown in FIG. 3. The power supply control signal 453 may be received by the second regulated power supply (e.g., the second regulated power supply 325) causing the second regulated power supply to maintain operation.

As described above, when an AC power outage occurs, the output signal 426 of the comparator 420 may cease changing state and may maintain a high state. With the output signal 426 of the comparator 420 in a high state, the capacitor C1 may charge to a voltage level high enough to generate a gate drive signal 452 to turn on the first circuit M1. When the first circuit M1 turns on, the power supply control signal 453 may change state to a low state causing the second regulated power supply to cease operation. Charging of the capacitor C1 may be delayed by the resistor R1, thereby delaying the turn on of the first circuit M1 and the change of state of the power supply control signal 453. In order to complete power-loss operations, the metrology processor may need the second regulated power supply to continue to supply power.

While operation of the power supply control circuit has been described using an example of a transistor, other circuitry, for example, but not limited to logic devices, may be used to perform similar functions without departing from the scope of the present disclosure.

In accordance with aspects of the present disclosure, the metrology processor (e.g., the metrology processor 345) may generate a power supply hold-up signal 456 to enable the metrology processor to complete power-loss operations. The power supply hold-up signal 456 may be the power supply hold-up signal 354 illustrated in FIG. 3. The power supply hold-up signal 456 in a high state may be received by the power supply hold-up circuit 455. The power supply hold-up circuit 455 may include a second circuit M2. The second circuit M2 may be, for example, a metal-oxide field-effect transistor, logic circuitry, or another type of transistor or circuit. The power supply hold-up signal 456 in the high state may be applied as a gate drive signal to the gate of the circuit M2 to cause the circuit M2 to turn on.

While operation of the power supply hold-up circuit has been described using an example of a transistor, other circuitry, for example, but not limited to logic devices, may be used to perform similar functions without departing from the scope of the present disclosure.

While the circuit M2 is turned on, a pull-down signal 457 may be generated to cause the gate of the circuit M1 to be held in a low state causing the circuit M1 to remain turned off. While the circuit M1 is turned off, the power supply control signal 453 will remain in a high state, thereby maintaining operation of the second regulated power supply which supplies power to the metrology processor. Thus, in the case of an AC power loss, the power supply hold-up signal 456 generated by the power supply hold-up circuit 455 may override an output signal 426 from the comparator 420 to prevent shutting down the second regulated power supply and the metrology processor.

When the metrology processor completes performance of its power-loss operations, the metrology processor may generate a power supply hold-up signal 456 in a low state. The power supply hold-up signal 456 in the low state may be received by the power supply hold-up circuit 455. The power supply hold-up signal 456 in the low state may be applied as a gate drive signal to the gate of the circuit M2 to cause the circuit M2 to turn off. When the circuit M2 is turned off, the capacitor C1 may charge to a voltage level high enough to generate a gate drive signal 452 to turn on the first circuit M1.

When the first circuit M1 turns on, the power supply control signal 453 may change state to a low state causing the second regulated power supply to cease operation. Shutting down the second regulated power supply (e.g., the second regulated power supply 325) eliminates all additional current drawn by the second regulated power supply and any auxiliary circuitry (e.g., the auxiliary circuitry 340) powered by the second regulated power supply, including the metrology processor, thereby conserving energy that can be used for last gasp communications by the AMI/AMR radio. When the energy stored in the electricity meter, for example in the capacitors 270, is exhausted, the off-line switching power supply (e.g., the off-line switching power supply 310) and the remainder of the circuitry in the electricity meter may cease operation.

If AC line voltage is restored, the off-line switching power supply may resume operation and may generate the HVDC voltage (e.g., 12 V or another voltage). The AC sense circuit 410 of the AC detection circuit 400 may receive the representation of the AC line voltage and the representation of the HVDC voltage at the comparator 420, thereby causing the output signal 426 of the comparator 420 to generate a square wave as described above. The output signal 426 of the comparator 420 may be applied to the cathode of the diode D2 of the power supply control circuit 450 causing the signal 451 at the anode of diode D2 to toggle between a low state of approximately zero volts and a high state of approximately the HVDC voltage level.

The time constant provided by R1 and C1 will discharge C1 through the comparator 420 each time the output signal 426 of the comparator 420 switches to a low state, thereby preventing the gate drive signal 452 for M1 from reaching a voltage high enough to turn on circuit M1. With M1 maintained in an off state, the power supply control signal 453 to the second regulated power supply (e.g., the second regulated power supply 325) will be maintained in a high state thereby causing the second regulated power supply to resume operation and supply power to the auxiliary circuitry 340 including the metrology processor 345.

While signals provided to and generated by the AC sense circuit 410, the power supply control circuit 450, and the power supply hold-up circuit 455 have been described in terms of high and low states, it should be appreciated that the designation of high and low states is relative and that signals having different states may be used without departing from the scope of the present disclosure. Further, logic and voltage levels may be manipulated throughout the implementation based on component selection.

The circuits M1 and M2 may be implemented by various transistor types or other switching components may be used without departing from the scope of the present disclosure.

Logic functions such as sensing AC line voltage, generating signals to the switches, etc., may be implemented with logic gates or other discrete components in combination with or alternative to the processor without departing from the scope of the present disclosure. Passive component (e.g., resistors and capacitors) values may be manipulated to provide desired timing or performance over temperature or different operating voltages without departing from the scope of the present disclosure.

While the power supply hold-up signal 456 has been described as being generated by the metrology processor, it should be appreciated that other components or circuitry may generate the power supply hold-up signal, including a delay circuit. For example, a delay circuit may be configured to prevent shut down of the second regulated power supply until the delay circuit detects that power-loss operations are complete.

Figure 5:
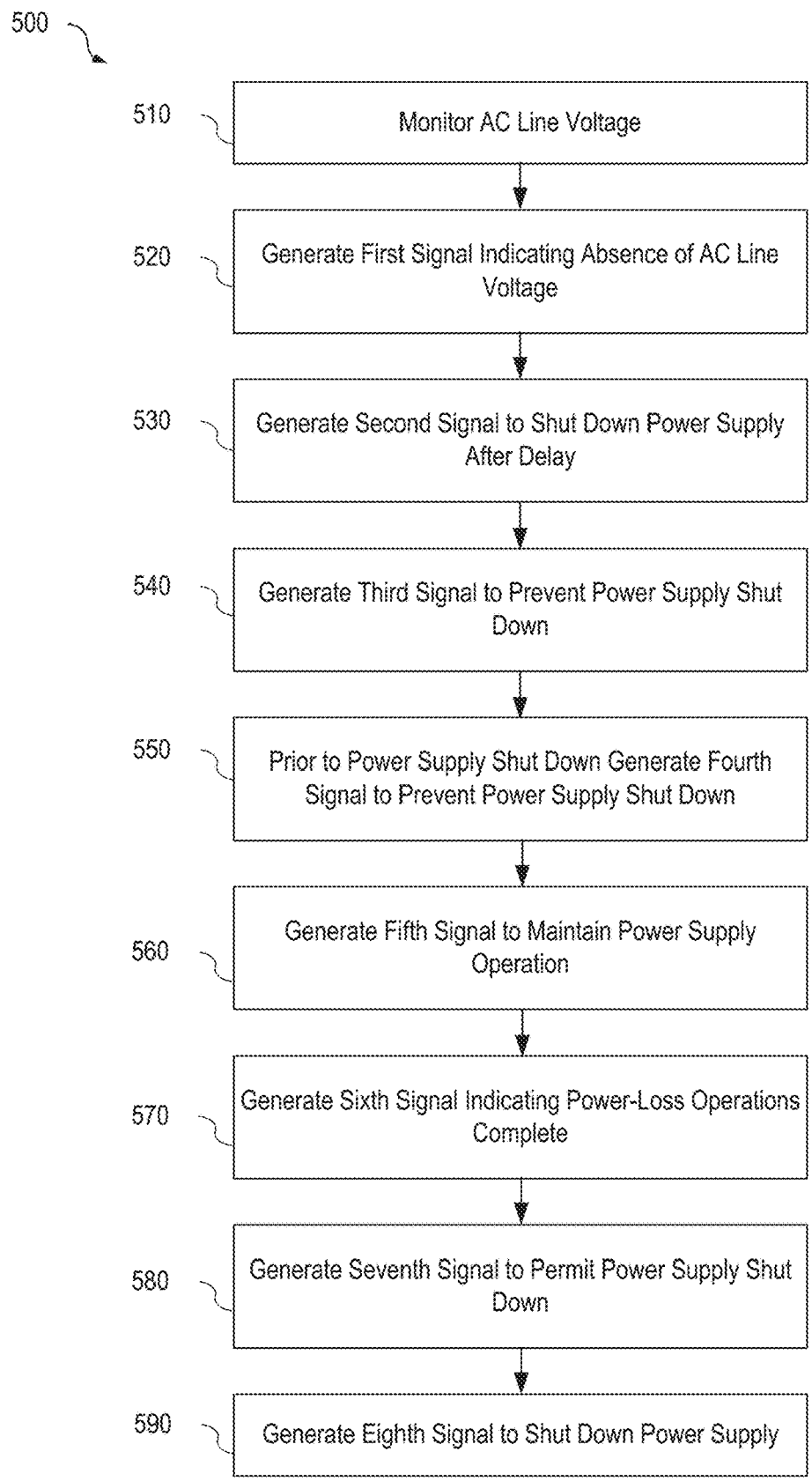
FIG. 5 is a flowchart illustrating an example of a method for operating an electricity meter during a loss of AC power according to aspects of the present disclosure.

FIG. 5 is a flowchart illustrating an example of a method 500 for operating an electricity meter during a loss of AC power, according to aspects of the present disclosure. Referring to FIG. 5, at block 510, a loss of AC line voltage may be sensed. The AC sense circuit of the AC detection circuit may monitor the AC line voltage at the electrical power grid. The AC sense circuit may generate an AC Sense signal 440 that is transmitted to the metrology processor (e.g., the metrology processor 345). The AC Sense signal 440 may be a time-varying signal when the presence of AC line voltage is sensed and a DC signal when is sensed an absence of AC line voltage.

At block 520, a signal may be generated indicating an absence of AC line voltage. When the AC sense circuit senses an absence of AC line voltage, it may generate first signal 426 to a power supply control circuit (e.g., the power supply control circuit 450) of the AC detection circuit 400. The first signal 426 may be, for example, a DC signal indicating the absence of AC line voltage. The first signal 426 may also cause the AC Sense signal 440 to transition to a DC signal that is transmitted to the metrology processor 345 indicating the absence of AC line voltage.

At block 530, a signal may be generated to cause a power supply to shut down. Based on receiving the first signal from the AC sense circuit, the power supply control circuit may generate a second signal 451 at the anode of the diode D2. The second signal 451 may be a DC signal that begins charging the capacitor C1 towards a voltage that can turn on the first switch M1. When the capacitor C1 charges to a voltage sufficient to turn on the first switch M1, the power supply control signal 453 transmitted to the second regulated power supply 325 may transition from a high state to a low state to shut down the power supply. The second regulated power supply 325 may be configured to supply power to the metrology processor 345. Thus, shut down of the second regulated power supply 325 may shut down the metrology processor 345 and all additional circuitry powered by the second regulated power supply 325. Generation of the shutdown signal to the power supply may be delayed by an RC circuit in the power supply control circuit.

At block 540, a signal may be generated to a power supply hold-up circuit of the AC detection circuit. In response to receiving the first signal 426, the metrology processor 345 may generate a third signal (e.g., the power supply hold-up signal 456 in a high state) to a power supply hold-up circuit (e.g., the power supply hold-up circuit 455) of the AC detection circuit to prevent shut down of the second regulated power supply 325.

At block 550, a signal may be generated to the power supply control circuit. In response to receiving the power supply hold-up signal 456, the power supply hold-up circuit 455 may generate a fourth signal (e.g., the pull-down signal 457 in a low state) to the power supply control circuit 450. The power supply hold-up signal 456 in a high state may cause the output signal of a switch device, for example, but not limited to, a transistor, of the power supply hold-up circuit to change state, thereby generating the pull-down signal 457 in the low state.

At block 560, a signal may be generated to maintain operation of the power supply. In response to receiving the pull-down signal 457 in the low state, the power supply control circuit may generate a fifth signal (e.g., the power supply control signal 453 in a high state) to the second regulated power supply 325. The fifth signal (e.g., the power supply control signal 453 in a high state) may be configured to maintain operation of the second regulated power supply 325 and permit the metrology processor 345 to complete power-loss operations. The fourth signal (e.g., the pull-down signal 457) may override the second signal (e.g., the signal 451 at the anode of the diode D2) during the loss of AC line voltage.

At block 570, a signal may be generated to the power supply hold-up circuit indicating that power-loss operations are complete. Upon completion of the power loss operations, the metrology processor 345 may generate a sixth signal (e.g., the power supply hold-up signal 456 in a low state) to the power supply hold-up circuit 455 indicating that the metrology processor has completed the power-loss operations.

At block 580, a signal may be generated to the power supply control circuit to permit power supply shut down. In response to receiving the power supply hold-up signal 456 in a low state, the power supply hold-up circuit may generate a seventh signal to the power supply control circuit. The seventh signal may be a release of the pull-down signal 457 from the low state thereby enabling the second signal (e.g., the signal 451 at the anode of the diode D2) to control the first circuit M1. The sixth signal may cause the output signal of a switch device M2, for example, but not limited to, a transistor, of the power supply hold-up circuit to change state, thereby generating the seventh signal. The seventh signal may release control of the power supply control circuit by the power supply hold-up circuit.

At block 590, a signal may be generated to cause the power supply to shut down. In response to receiving the seventh signal from the power supply hold-up circuit, the power supply control circuit may generate an eighth signal (e.g., the power supply control signal 453 in a low state) to the second regulated power supply 325, thereby causing the power supply to shut down. The eighth signal may permit the RC circuit in the power supply control circuit to charge to a voltage sufficient to cause the switch device to change state, thereby generating the eighth signal.

The specific operations illustrated in FIG. 5 provide a particular method for operating an electricity meter during a loss of AC power according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 5 may include multiple sub-operations that may be performed in various sequences as appropriate to the individual operation. Furthermore, additional operations may be added or removed depending on the particular applications.

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. An alternating current (AC) line voltage detection circuit comprising:
   an AC sense circuit;
   a power supply control circuit; and
   a power supply hold-up circuit,
   wherein the AC sense circuit is configured to generate a signal to a processor and to the power supply control circuit in response to sensing an absence of AC line voltage,
   wherein in response to receiving the signal from the AC sense circuit, the power supply control circuit is configured to generate a control signal to a power supply to shut down the power supply, wherein the power supply is configured to provide power to the processor,
   wherein in response to receiving the signal from the AC sense circuit, the processor is configured generate a signal to the power supply hold-up circuit,
   in response to receiving the signal from the processor, the power supply hold-up circuit is configured to generate a signal to the power supply control circuit to prevent shut down of the power supply, wherein the signal generated by the power supply hold-up circuit overrides the signal from the AC sense circuit, and
   wherein the processor is further configured to generate a subsequent signal to the power supply hold-up circuit to permit shut down of the power supply and the processor.

2. The AC line voltage detection circuit of claim 1, wherein the AC sense circuit is configured to sense a presence or an absence of AC line voltage and generate a signal to the processor,
   wherein in response to detecting the presence of AC line voltage, the AC sense circuit is configured to generate a first signal to the processor and a second signal to the power supply control circuit, and
   in response to detecting the absence of AC line voltage, the AC sense circuit is configured to generate a third signal to the processor and a fourth signal to the power supply control circuit.

3. The AC line voltage detection circuit of claim 2, wherein the first signal and the second signal are time varying signals, and the third signal and the fourth signal are DC signals.

4. The AC line voltage detection circuit of claim 2, wherein the power supply control circuit comprises a first circuit coupled to a resistor-capacitor (RC) circuit and a diode,
   wherein in response to receiving the second signal from the AC sense circuit, the RC circuit and the diode maintain the first circuit in a first state, and
   wherein the first circuit in the first state causes a signal to be transmitted to the power supply to maintain power supply operation.

5. The AC line voltage detection circuit of claim 4, wherein in response to receiving the fourth signal from the AC sense circuit, the RC circuit and the diode maintain the first circuit in a second state, and
   wherein the first circuit in the second state causes a signal to be transmitted to the power supply to shut down operation of the power supply.

6. The AC line voltage detection circuit of claim 4, wherein the first circuit is a logic circuit or a transistor.

7. The AC line voltage detection circuit of claim 4, wherein in response to receiving the third signal from the AC sense circuit, the processor or a delay circuit is configured to generate a signal to the power supply hold-up circuit,
   wherein the signal to the power supply hold-up circuit overrides the third signal from the AC sense circuit and prevents the power supply from shutting down.

8. The AC line voltage detection circuit of claim 7, wherein the power supply hold-up circuit comprises a second circuit,
   wherein in response to receiving the signal from the processor or the delay circuit, the second circuit is configured to change from a first state to a second state, and
   wherein in the second state the second circuit is configured to cause the signal to the power supply control circuit that overrides the second signal from the AC sense circuit to be generated.

9. The AC line voltage detection circuit of claim 8, wherein the second circuit is a logic circuit or a transistor.

10. The AC line voltage detection circuit of claim 7, wherein the processor is configured to generate the signal to the power supply hold-up circuit for a period of time for the processor to complete power-loss operations.

11. The AC line voltage detection circuit of claim 10, wherein the power-loss operations comprise one or more of performing measurements of voltage or current or both, processing data related to a loss of AC power, or transmitting data to a radio of an electricity meter for subsequent transmission to a head end system.

12. An electricity meter, comprising:
    a processor configured to control operations of portions of circuitry of the electricity meter;
    a power supply configured to supply power to the processor; and
    an alternating current (AC) line voltage detection circuit comprising:
      an AC sense circuit;
      a power supply control circuit; and
      a power supply hold-up circuit,
      wherein the power supply control circuit is configured to generate a signal to the power supply based on a signal received from the AC sense circuit and a signal received from the power supply hold-up circuit,
      wherein the signal generated by the power supply control circuit causes the power supply to either maintain operation or shut down according to the signals received from the AC sense circuit and the power supply hold-up circuit.

13. The electricity meter of claim 12, wherein the AC sense circuit is configured to generate a first signal to the processor and the power supply control circuit when AC line voltage is sensed and to generate a second signal to the processor and the power supply control circuit when AC line voltage is not sensed.

14. The electricity meter of claim 13, wherein the first signal is a time varying signal, and the second signal is a direct current (DC) signal.

15. The electricity meter of claim 13, wherein the power supply control circuit comprises a first circuit coupled to a resistor-capacitor (RC) circuit and a diode,
    wherein the RC circuit and the diode are configured to maintain the first circuit in a first state upon receipt of the first signal from the AC sense circuit, and wherein the first circuit in the first state is configured to cause a signal to be transmitted to the power supply to maintain power supply operation.

16. The electricity meter of claim 15, wherein the RC circuit and the diode are configured to maintain the first circuit in a second state upon receipt of the second signal from the AC sense circuit, and
wherein the first circuit in the second state causes a signal to be transmitted to the power supply to shut down operation of the power supply.

17. The electricity meter of claim 15, wherein the first circuit is a logic circuit or a transistor.

18. The electricity meter of claim 13, wherein in response to receiving the second signal from the AC sense circuit, the processor or a delay circuit is configured to generate a signal to the power supply hold-up circuit,
wherein the signal to the power supply hold-up circuit is configured to override the second signal from the AC sense circuit and prevent the power supply from shutting down.

19. The electricity meter of claim 18, wherein the power supply hold-up circuit comprises a second circuit,
wherein in response to receiving the signal from the processor, the second circuit is configured to change from a first state to a second state, and
wherein in the second state the second circuit is configured to cause the signal to the power supply control circuit that overrides the second signal from the AC sense circuit to be generated.

20. The electricity meter of claim 19, wherein the second circuit is a logic circuit or a transistor.

21. The electricity meter of claim 18, wherein the processor or the delay circuit is configured to generate the signal to the power supply hold-up circuit for a period of time for the processor to complete power-loss operations.

22. The electricity meter of claim 21, wherein the power-loss operations comprise one or more of performing measurements of voltage or current or both, processing data related to a loss of AC power, or transmitting data to a radio of the electricity meter for subsequent transmission to a head end system.

23. A method for operating an electricity meter during a loss of alternating current (AC) power, the method comprising:
sensing, by an AC sense circuit, an absence of AC line voltage;
generating, by the AC sense circuit, a first signal to a processor and to a power supply control circuit indicating a sensed loss of AC line voltage;
generating, by the power supply control circuit, a second signal configured to cause a power supply to shut down, wherein the second signal is generated after a delay time, and wherein the power supply is configured to supply power to the processor;
in response to receiving the first signal, generating, by the processor, a third signal to a hold-up circuit to prevent shut down of the power supply;
in response to receiving the third signal, generating, by the hold-up circuit, a fourth signal to the power supply control circuit prior to an end of the delay time;
in response to receiving the fourth signal, generating, by the power supply control circuit, a fifth signal to the power supply, wherein the fifth signal is configured to maintain operation of the power supply and permit the processor to complete power-loss operations, wherein the fourth signal overrides the second signal during the loss of AC line voltage;
generating, by the processor, upon completion of the power loss operations, a sixth signal to the hold-up circuit indicating that the processor has completed the power-loss operations;
in response to receiving the sixth signal, generating, by the hold-up circuit, a seventh signal to the power supply control circuit, wherein the seventh signal causes the power supply control circuit to be controlled by the first signal; and
in response to receiving the seventh signal, generating, by the power supply control circuit, an eighth signal to the power supply, wherein the eighth signal causes the power supply to shut down,
wherein shutting down the power supply shuts down the processor and other circuitry powered by the power supply.

24. The method of claim 23, wherein the power loss operations comprise one or more of performing measurements of voltage or current or both, processing data related to a loss of AC power, or transmitting data to a radio of the electricity meter for subsequent transmission to a head end system.

* * * * *